(12) United States Patent
Robertson

(10) Patent No.: US 9,331,633 B1
(45) Date of Patent: May 3, 2016

(54) SYSTEM AND METHOD FOR ELIMINATING INTERMODULATION

(71) Applicant: ANRITSU COMPANY, Morgan Hill, CA (US)

(72) Inventor: Stephen Andrew Robertson, San Jose, CA (US)

(73) Assignee: ANRITSU COMPANY, Morgan Hill, CA (US)

( * ) Notice: Subject to any disclaimer, the term of this patent is extended or adjusted under 35 U.S.C. 154(b) by 73 days.

(21) Appl. No.: 14/213,221

(22) Filed: Mar. 14, 2014

Related U.S. Application Data

(60) Provisional application No. 61/799,480, filed on Mar. 15, 2013.

(51) Int. Cl.
H04L 25/08 (2006.01)
H03D 7/14 (2006.01)

(52) U.S. Cl.
CPC ...................................... H03D 7/14 (2013.01)

(58) Field of Classification Search
CPC .. H03F 1/3211; H03F 1/3223; H04L 27/2691
USPC .......... 375/346, 296; 455/503, 67.3; 330/149
See application file for complete search history.

(56) References Cited

U.S. PATENT DOCUMENTS

| | | | |
|---|---|---|---|
| 2,594,328 A | 4/1952 | Marchetti | |
| 4,274,047 A | 6/1981 | Hecken | |
| 4,991,098 A | 2/1991 | Dantzler | |
| 5,479,090 A | 12/1995 | Schultz | |
| 5,513,094 A | 4/1996 | Stanley | |
| 5,589,797 A * | 12/1996 | Gans | H03F 1/3258 330/110 |
| 5,602,709 A | 2/1997 | Al-Dabbagh | |
| 5,706,010 A | 1/1998 | Franke | |
| 5,729,145 A | 3/1998 | Blades | |
| 5,973,568 A | 10/1999 | Shapiro | |
| 5,994,905 A | 11/1999 | Franchville | |
| 6,144,692 A | 11/2000 | Beck | |
| 7,068,096 B2 | 6/2006 | Chu | |

(Continued)

FOREIGN PATENT DOCUMENTS

| | | |
|---|---|---|
| WO | 03030416 | 4/2003 |
| WO | 2004017516 | 2/2004 |
| WO | 2012009757 | 1/2012 |

OTHER PUBLICATIONS

Bell, et al., Range to Fault Technology, 2011, 10 pages, Kaelus.

(Continued)

*Primary Examiner* — Daniel Washburn
*Assistant Examiner* — Fitwi Hailegiorgis
(74) *Attorney, Agent, or Firm* — Tucker Ellis LLP

(57) ABSTRACT

A system for adaptively eliminating intermods from a spectrum generated by combining two or more signals in a component or circuit includes a sampler for sampling an output signal of the component or circuit, a signal source for generating a conversion signal having a frequency matched to a target intermod of the spectrum, and a cancellation circuit to generate a cancellation phasor. The cancellation circuit is configured to receive the generated conversion signal and the sampled output signal and generate a cancellation phasor therefrom having a phase and amplitude configured to cancel the target intermod. A combining network can combine the cancellation phasor into the component or circuit to cancel the target intermod from the spectrum.

15 Claims, 5 Drawing Sheets

(56) References Cited

U.S. PATENT DOCUMENTS

| | | |
|---|---|---|
| 7,103,114 B1 | 9/2006 | Lapierre |
| 7,469,190 B2 | 12/2008 | Bickel |
| 7,511,472 B1 | 3/2009 | Xia |
| 7,598,714 B2 | 10/2009 | Stanley |
| 7,629,764 B2 | 12/2009 | Shoemaker |
| 7,696,850 B2 | 4/2010 | Stanford |
| 7,696,940 B1 | 4/2010 | MacDonald |
| 8,058,880 B2 | 11/2011 | Bradley |
| 8,294,469 B2 | 10/2012 | Bradley |
| 8,498,582 B1 | 7/2013 | Bradley |
| 8,666,322 B1 | 3/2014 | Bradley |
| 8,816,672 B1 | 8/2014 | Bradley |
| 8,903,324 B1 | 12/2014 | Bradley |
| 2002/0030871 A1 | 3/2002 | Anderson |
| 2002/0094785 A1* | 7/2002 | Deats .......... H04B 1/1027 455/67.13 |
| 2003/0064738 A1* | 4/2003 | Posner .......... H03F 1/3247 455/503 |
| 2003/0232600 A1 | 12/2003 | Montgomery |
| 2005/0141602 A1 | 6/2005 | Hyun |
| 2006/0202900 A1 | 9/2006 | Simile |
| 2009/0096466 A1 | 4/2009 | Delforce |
| 2009/0124122 A1 | 5/2009 | Stanford |
| 2009/0125253 A1 | 5/2009 | Blair |
| 2010/0029553 A1 | 2/2010 | Scheibel |
| 2010/0052652 A1 | 3/2010 | Mitchell |
| 2010/0085061 A1 | 4/2010 | Bradley |
| 2010/0164504 A1 | 7/2010 | Bradley |
| 2010/0194382 A1 | 8/2010 | Montena |
| 2010/0295533 A1 | 11/2010 | Kuga |
| 2012/0086612 A1 | 4/2012 | Linehan |
| 2013/0071112 A1 | 3/2013 | Melester |
| 2013/0182753 A1 | 7/2013 | Delforce |
| 2014/0146866 A1 | 5/2014 | Strachan |

OTHER PUBLICATIONS

Lui, Passive Intermodulation Interference in Communication Systems, Jun. 1990, pp. 109-118, vol. 2, Issue 3, Electronics & Communication Engineering Journal.
Eron, PIM Requirements for Low Power Wireless Components and Subsystems, White Paper, 4 pages, Microlab.
Hartman, et al., PIM Test Power Levels for Mobile Communications Systems, 2012, 8 pages, Kaelus.
Holzman, Essentials of RP and microwave grounding, Chapter 4: Transmission Line Transitions, 2006, 31 pages, Artech House, Inc.

* cited by examiner

SYSTEM AND METHOD FOR ELIMINATING INTERMODULATION

CLAIM OF PRIORITY

This application claims the benefit of priority to U.S. Provisional Application titled "SYSTEM AND METHOD FOR ELIMINATING INTERMODULATION", Application No. 61/799,480, filed Mar. 15, 2013, which application is herein incorporated by reference.

TECHNICAL FIELD

The present application relates to signal generation for use in measurement systems and controlling intermodulation in generated signals.

BACKGROUND

Intermodulation or intermodulation distortion (IMD) is the amplitude modulation of signals containing two or more different frequencies in a system with nonlinearities. For example, when two or more frequencies are passed through an amplifier, non-linearities in the amplifier result in distortion and cause the production of secondary signals that were not originally present. These secondary signals, or intermods as they are known, can interfere with receivers if they happen to coincide with the reception bands of any receivers in the vicinity. The intermodulation between each frequency component will form secondary signals at frequencies that are not just at harmonic frequencies (integer multiples) of either, but also at the sum and difference frequencies of the original frequencies and at multiples of those sum and difference frequencies.

SUMMARY

In an embodiment, a system for adaptively eliminating intermods from a spectrum generated by combining two or more signals in a component or circuit includes a sampler for sampling an output signal of the component or circuit, a signal source for generating a conversion signal having a frequency matched to a target intermod of the spectrum, and a cancellation circuit to generate a cancellation phasor. The cancellation circuit is configured to receive the generated conversion signal and the sampled output signal and generate a cancellation phasor therefrom having a phase and amplitude configured to cancel the target intermod. A combining network can combine the cancellation phasor into the component or circuit to cancel the target intermod from the spectrum. In an embodiment, the sampler is a directional coupler.

In an embodiment, a frequency of the conversion signal generated by the signal source is settable based on the two or more signals in the component or circuit and an intermod selected from a series of intermods generated by the two or more signals to be the target intermod. The signal source is adaptively resettable based on one or both of a change in frequency of the two or more signals and a reselection of the target intermod.

In an embodiment, the system includes a plurality of signal sources, each signal source generating a respective conversion signal having a frequency matched to a respective target intermod of the spectrum. A plurality of cancellation circuit can each receive the generate conversion signal from an associated signal source from the plurality of signal sources and the sampled output signal and generate a respective cancellation phasor having a phase and amplitude configured to cancel the respective target intermod.

In an embodiment, the cancellation circuit includes a first incident-quadrature (IQ) demodulator that receives the sampled output signal and the generated conversion signal and mixes the signals to generate I and Q components, a pair of integrators to integrate and amplify the I and Q components, and a second IQ demodulator to generate the cancellation phasor from the integrated and amplified I and Q components. A polarity reversal switch can be arranged between the first and second IQ demodulators for each of the I and Q components.

In an embodiment, the system includes a level control circuit including a variable gain amplifier (VGA) that receives and amplifies signals generated in the component or circuit, and a feedback loop connected between the VGA and the sampler for controlling the gain of the variable gain amplifier to thereby control the level of the output signal.

In an embodiment, the system includes an intermod cancellation pre-selector for reducing levels of frequencies within the sampled output signal other than the frequency of the target intermod.

In an embodiment, a method for adaptively eliminating intermods from a spectrum generated by combining two or more signals in a component or circuit, includes sampling an output signal of the component or circuit, generating a conversion signal having a frequency matched to a target intermod of the spectrum, and generating a cancellation phasor having a phase and amplitude configured to cancel the target intermod based on the generated conversion signal and the sampled output signal. The cancellation phasor is then combined into the component or circuit to cancel the target intermod from the spectrum generated by the combining of the two or more signals.

In an embodiment, the method includes setting a frequency of the conversion signal generated by the signal source based on the two or more signals in the component or circuit and an intermod selected from a series of intermods generated by the two or more signals to be the target intermod. The signal source is adaptively resettable based on one or both of a change in frequency of the two or more signals and a reselection of the target intermod.

In an embodiment, the method includes generating a plurality of conversion signals, each having a frequency matched to a different respective target intermod of the spectrum and generating a respective cancellation phasor for each of the different respective target intermods based on the associated conversion signal and the sampled output signal.

In an embodiment, the method includes wherein the generating the cancellation phasor includes mixing the generated conversion signal and the sampled output signal to obtain I and Q components, integrating and amplifying the I and Q components, reversing a polarity of the I and Q components, and mixing the generated conversion signal with the I and Q components to generate the cancellation phasor.

In an embodiment, A non-transitory computer readable storage medium, including instructions stored thereon which when read and executed by one or more computers cause the one or more computers to perform the steps including sampling an output signal of the component or circuit, generating a conversion signal having a frequency matched to a target intermod of the spectrum, and generating a cancellation phasor having a phase and amplitude configured to cancel the target intermod based on the generated conversion signal and the sampled output signal. The cancellation phasor is combined into the component or circuit to cancel the target intermod from the spectrum generated by the combining of the two or more signals.

DETAILED DESCRIPTION

The following description is of the best modes presently contemplated for practicing various embodiments of the present invention. The description is not to be taken in a limiting sense but is made merely for the purpose of describing the general principles of the invention. The scope of the invention should be ascertained with reference to the claims.

It would be apparent to one of skill in the art that the present invention, as described below, may be implemented in many different embodiments of hardware, software, firmware, and/ or the entities illustrated in the figures. Any actual software, firmware and/or hardware described herein is not limiting of the present invention. Thus, the operation and behavior of the present invention will be described with the understanding that modifications and variations of the embodiments are possible, given the level of detail presented herein.

Embodiments of systems and methods in accordance with the present invention can be used to generate a signal unique to an original signal which, when applied to an amplifier or other circuitry, can cancel out an intermodulation signal (also referred to herein as an intermod) as the intermodulation signal is created.

Figure 1:
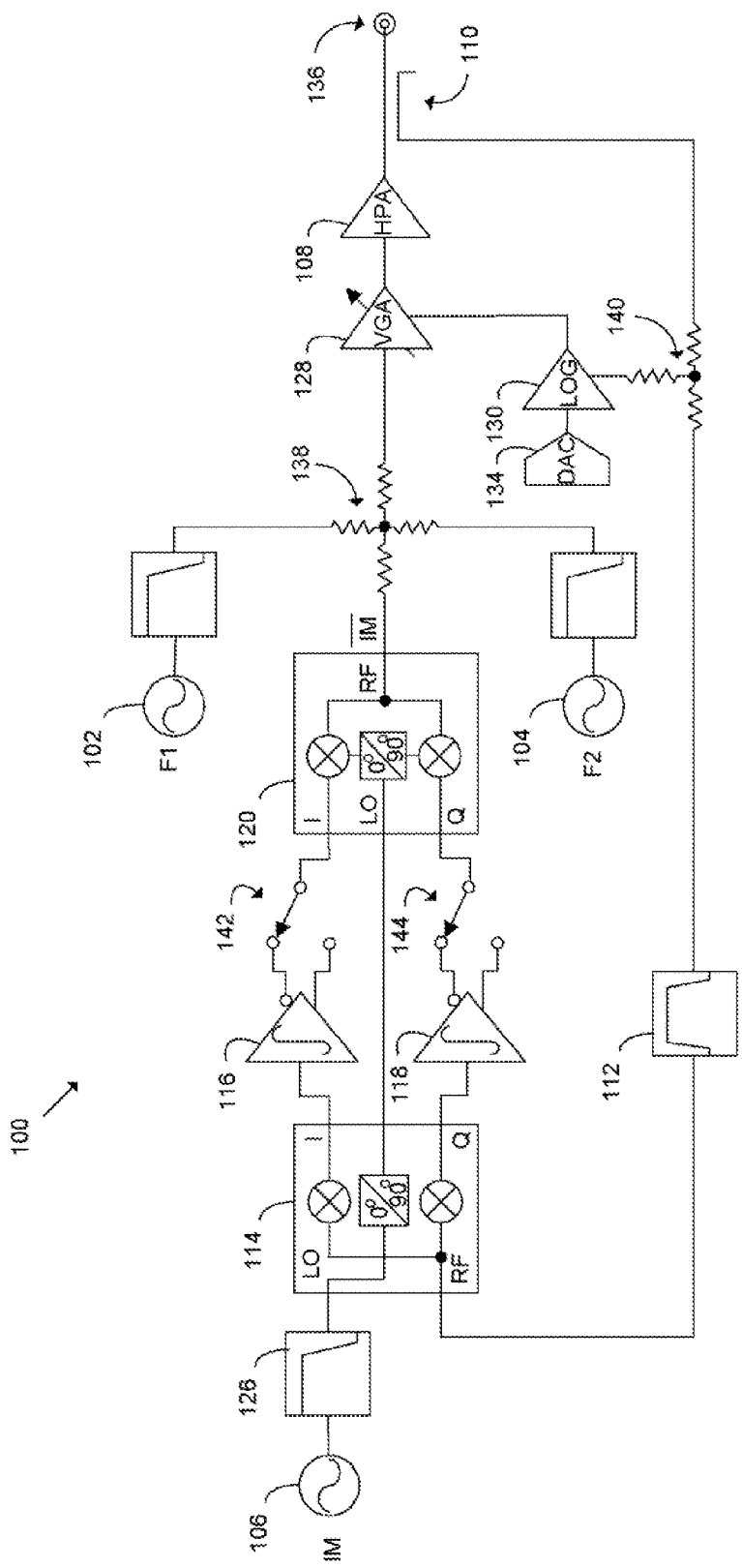
FIG. 1 is a block diagram of an embodiment of a circuit for eliminating an intermod in accordance with the present invention.

FIG. 1 is a block diagram of a circuit 100 for eliminating an intermod in accordance with an embodiment. The circuit adaptively introduces a unique signal to an original signal which, when applied to an amplifier or other circuitry, cancels out a particular intermod as it is created.

Figure 2:
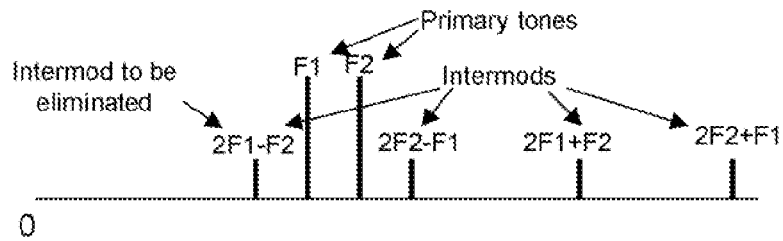
FIG. 2 illustrates a spectrum with four possible intermods, one of which is to be eliminated.

FIG. 2 illustrates a series of intermods and primary tones, showing the intermod to be eliminated in one example. The circuit is useable with systems and method for suppressing or eliminating intermods. Further, the circuit is capable of selectively suppressing or eliminating particular tone or tones, and system and methods are intended to cover such embodiments. Embodiments of circuits, systems, and methods in accordance with the present invention comprise circuitry that can remove undesired signals by adaptively adjusting to produce a cancellation signal that vectorially suppresses a particular intermod from the output of amplifiers and/or other follow-on circuitry where it would otherwise appear. Embodiments of circuits, systems and methods can reduce the need for post-amplification filtering, and allow low-level tones to be combined prior to power amplification when, because of severe filtering requirements, this is not otherwise practical.

Figure 3:
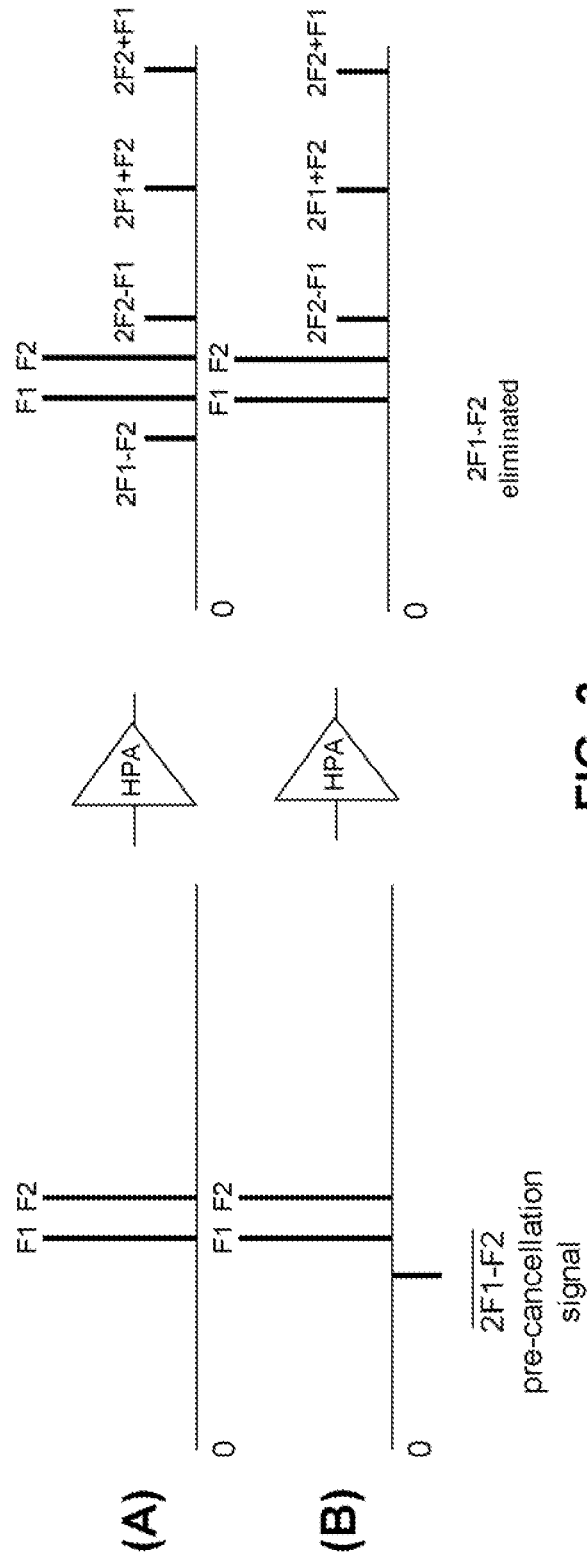
FIG. 3A illustrates an open-loop spectrum seen at a sampling point of the circuit of FIG. 1.
FIG. 3B illustrates a closed-loop spectrum seen at the sampling point of the circuit of FIG. 1. A pre-cancellation signal is injected before intermodulation is created. Amplitude and phasing are adaptively adjusted so the two signals cancel each other out

Referring back to FIG. 1, tones F1 and F2 can be generated by a pair of signal generators 102, 104 that are combinable in an appropriate matching and/or combining network 138, where they are applied to a variable-gain amplifier 128 for level control. It is noted that level control is optional. The two-tone composite is then fed to a series of one or more power amplifiers 108 and/or other circuitry, where it can be sampled by a suitable coupling device such as, but not limited to, a directional coupler 110, and on to an output port such as a transmission line or antenna 136. FIG. 3A illustrates an open-loop spectrum seen at the sampling point (in this case, the coupler 110). A coupled signal can be fed back to another suitable matching and or combining network 140 for the distribution to an optional level control circuit including components 128, 130, 134.

A coupled signal can also optionally be fed to a cancellation pre-selector 112, which can improve signal-to-noise ratio by reducing the level of all but the intermod signal being adaptively suppressed. The pre-selector output is then multiplied in quadrature against a local oscillator (LO) signal at an incident-quadrature (IQ) demodulator 114. The LO signal is provided by synthesizer or oscillator 106, which is set to the frequency of the intermod being suppressed. The LO signal is optionally filtered by a low-pass filter 126 to remove any adverse harmonic content before being applied to IQ demodulator 114, where baseband direct current (DC) voltages I and Q are recovered.

Figure 4:
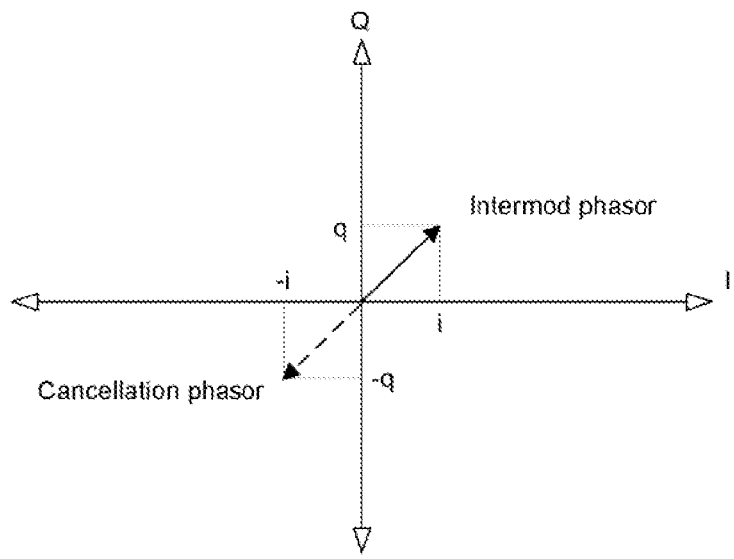
FIG. 4 is a Cartesian representation of intermod and cancellation phasors.
Figure 5:
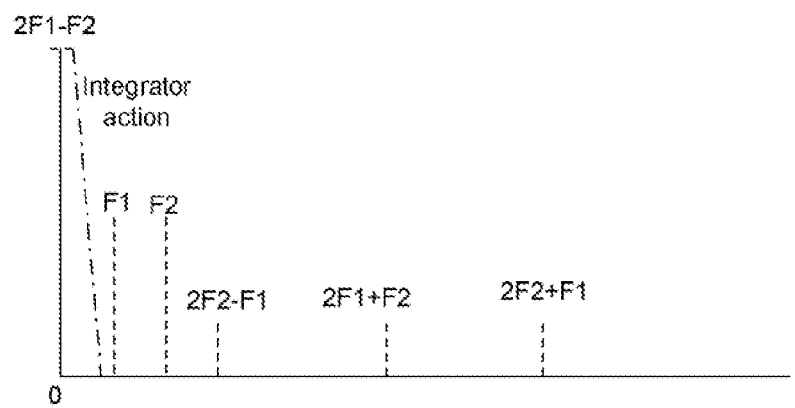
FIG. 5 illustrates that only the intermod to be suppressed is converted to DC, where integrator gain is extremely high.

Referring to FIG. 4, voltages I and Q represent separate, orthogonal, one-dimensional basis vectors which together describe the exact phase and magnitude (relative to the LO) of the intermod being suppressed. As separate, one-dimensional quantities, I and Q can each be amplified and integrated over time separately, making them both independently adaptive. As shown in FIG. 5, only the intermod to be suppressed is converted to DC, where integrator gain is extremely high. In embodiments, the relative loop phasing can also be adjusted in 90-degree increments by inverting either, both, or neither signal as necessary to compensate for phase-shifts around the loop. This ensures that any conceivable phasing still allows signal capture and suppression.

Baseband signals I and Q are first integrated by components 116 and 118, and then passed through polarity reversal switches 142 and 144 as needed to produce an appropriate cancellation vector. When the cancellation vector is processed by a second IQ modulator 120, (while using the same LO signal as the first IQ modulator 114), the resulting phasor signal is derived from the LO, but with the phase and amplitude necessary to cancel the intermod being suppressed. The phasor signal is combined with F1 and F2 at the combining network 138 to drive the follow-on circuitry 108, where the intermod would be produced if not for the action of the cancellation signal opposing it. FIG. 3B illustrates the pre-cancellation signal injected before the intermod is created and the spectrum after the intermods are created, with the targeted intermod having been eliminated. As shown, the output intermod is driven to zero, in accordance with control-loop theory.

Figure 6:
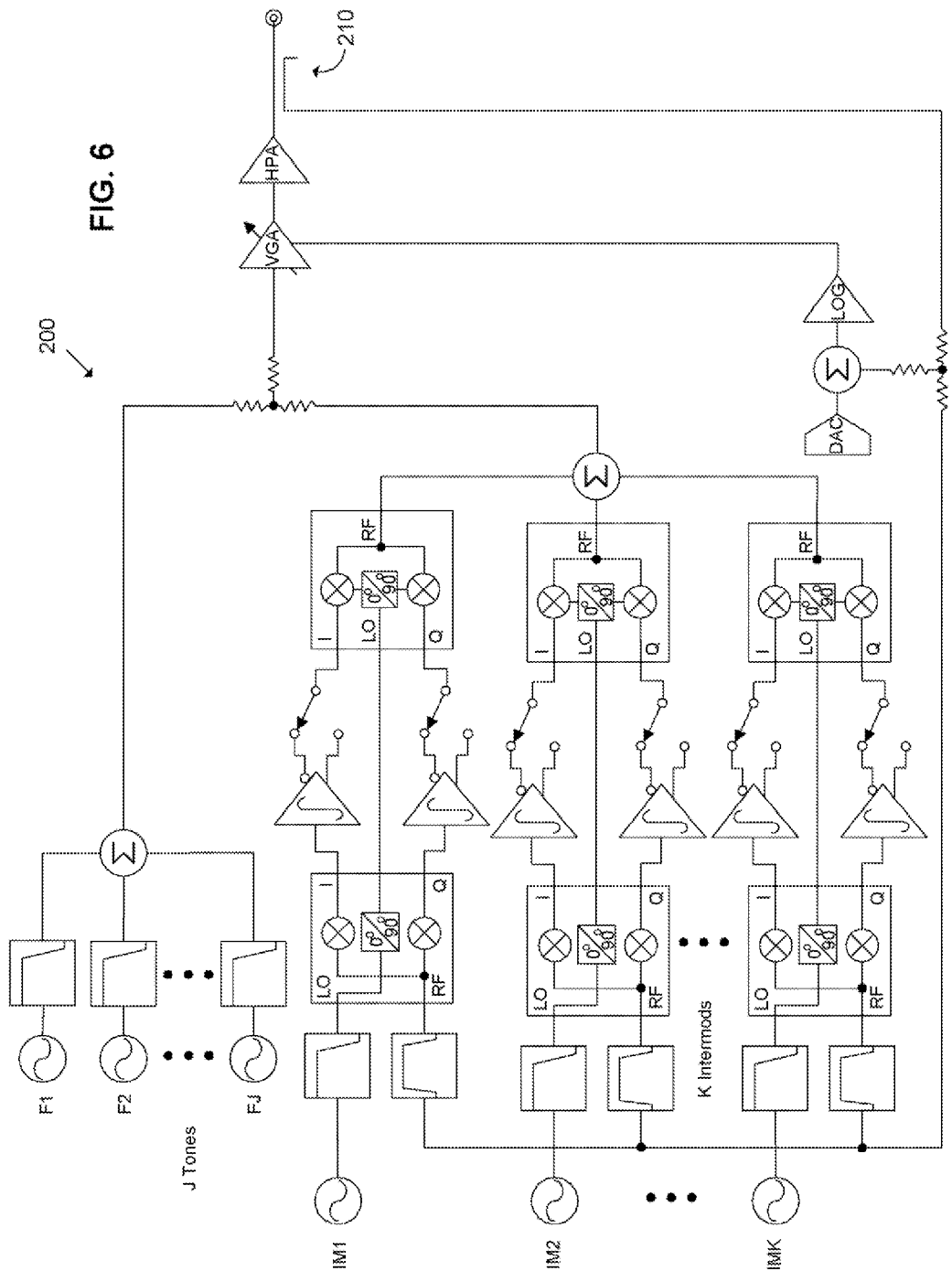
FIG. 6 is a block diagram of an embodiment of a circuit for eliminating multiple intermods in accordance with the present invention.

FIG. 6 is a block diagram of a circuit 200 for eliminating multiple intermods in accordance with an embodiment. Because the circuit is adaptive, it can also arbitrary tones. The circuit includes a single sample point 210 for the multiple intermod elimination circuitry, which each intermod operated as described above. As shown, the circuit includes "J" primary tones generated at "J" signal sources. As shown, a series of "K" signals, corresponding to frequencies of targeted intermods is generated by a series of "K" signal sources. For example, where all of the secondary tones are targeted for a circuit including two signal sources generating two primary tones F1 and F2, the circuit can include four IQ modulators along with four synthesizers or oscillators, each set to a frequency of a respective targeted intermod (e.g., J=2, K=4, IM1=2F1−F2, IM2=2F2−F1, IM3=2F1+F2, and IM4=2F2+F1). One of ordinary skill in the art will appreciate that this example is merely exemplary. Circuits in accordance with embodiments can have myriad different combinations of "J" tones and "K" intermods.

Figure 7:
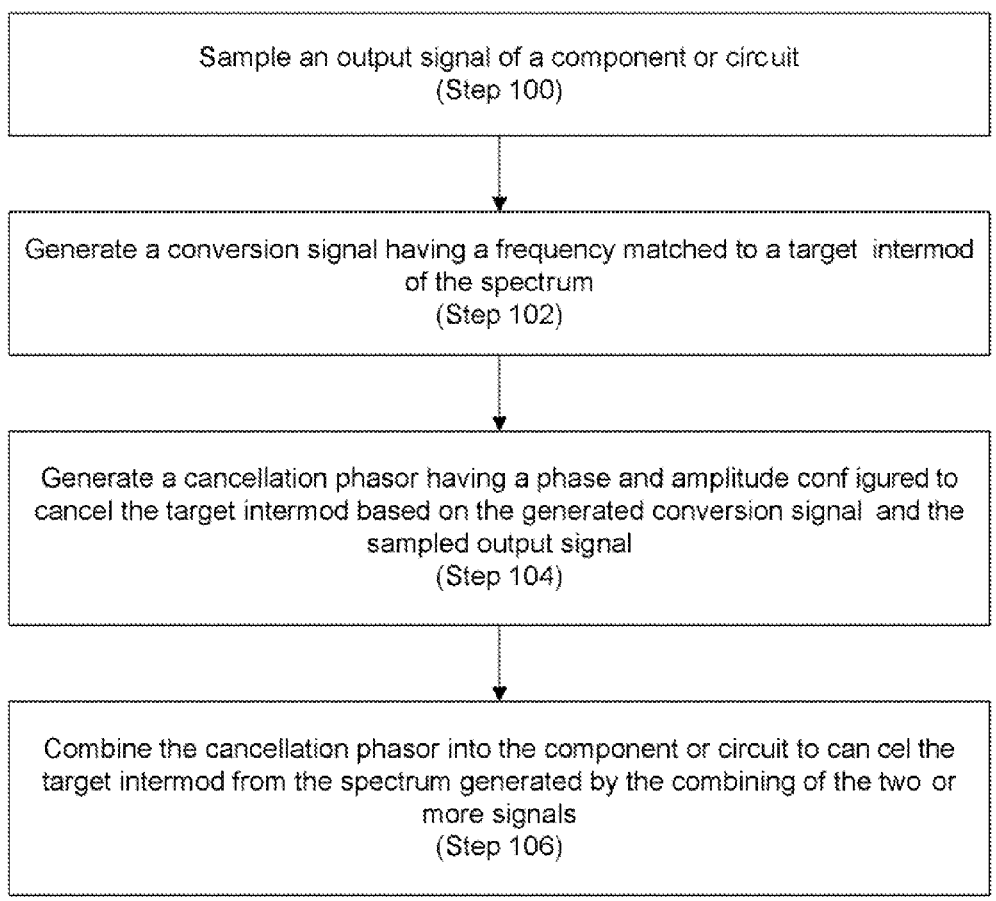
FIG. 7 is a flowchart of an embodiment of a method for adaptively eliminating intermods from a spectrum generated by combining two or more signals in a component or circuit.

FIG. 7 is a flowchart illustrating an embodiment of a method for adaptively eliminating intermods from a spectrum generated by combining two or more signals in a component or circuit. The method includes sampling an output signal of the component or circuit (Step 100), generating a conversion signal having a frequency matched to a target intermod of the spectrum (Step 102), and generating a cancellation phasor having a phase and amplitude configured to cancel the target intermod based on the generated conversion signal and the sampled output signal (Step 104). The target intermod can then be cancelled from the spectrum generated by the combining of the two or more signals by combining the cancellation phasor into the component or circuit (Step 106).

In some embodiments, the present invention includes a computer program product which is a non-transitory storage medium or computer readable medium (media) having instructions stored thereon/in which can be used to program a computer to perform any of the processes of the present invention. Examples of the storage medium can include, but is not limited to, any type of disk including floppy disks, optical discs, DVD, CD-ROMs, microdrive, and magneto-optical disks, ROMs, RAMs, EPROMs, EEPROMs, DRAMs, VRAMs, flash memory devices, magnetic or optical cards, nanosystems (including molecular memory ICs), or any type of media or device suitable for storing instructions and/or data.

The foregoing descriptions of the present invention have been presented for purposes of illustration and description. They are not intended to be exhaustive or to limit the invention to the precise forms disclosed. Many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

The invention claimed is:

1. A system for adaptively eliminating intermods from a spectrum generated by combining two or more signals in a component or circuit, comprising:
    a sampler for sampling an output signal of the component or circuit;
    a signal source for generating a conversion signal having a frequency matched to a target intermod of the spectrum;
    a cancellation circuit configured to receive the generated conversion signal and the sampled output signal and generate a cancellation phasor having a phase and amplitude configured to cancel the target intermod, wherein the cancellation circuit includes
        a first incident-quadrature (IQ) demodulator that receives the sampled output signal and the generated conversion signal and mixes the signals to generate I and Q components,
        a pair of integrators to integrate and amplify the I and Q components, and
        a second IQ demodulator to generate the cancellation phasor from the integrated and amplified I and Q components; and
    a combining network for combining the cancellation phasor into the component or circuit to cancel the target intermod from the spectrum generated by the combining of the two or more signals.

2. The system of claim 1, wherein a frequency of the conversion signal generated by the signal source is settable based on the two or more signals in the component or circuit and an intermod selected from a series of intermods generated by the two or more signals to be the target intermod;
    wherein the signal source is adaptively resettable based on one or both of a change in frequency of the two or more signals and a reselection of the target intermod.

3. The system of claim 1, further comprising:
    a plurality of signal sources, each signal source generating a respective conversion signal having a frequency matched to a respective target intermod of the spectrum; and
    a plurality of cancellation circuits each receiving the generated conversion signal from an associated signal source from the plurality of signal sources and the sampled output signal and generating a respective cancellation phasor having a phase and amplitude configured to cancel the respective target intermod.

4. The system of claim 3, wherein each of the cancellation circuits from the plurality of cancellation circuits includes
    a first incident-quadrature (IQ) demodulator that receives the sampled output signal and the generated conversion signal from the associated signal source and mixes the signals to generate I and Q components,
    a pair of integrators to integrate and amplify the I and Q components, and
    a second IQ demodulator to generate a respective cancellation phasor from the integrated and amplified I and Q components.

5. The system of claim 4, wherein each of the cancellation circuits from the plurality of cancellation circuits includes a polarity reversal switch arranged between the first and second IQ demodulators for each of the I and Q components.

6. The system of claim 1, wherein the cancellation circuit includes a polarity reversal switch arranged between the first and second IQ demodulators for each of the I and Q components.

7. The system of claim 1, further comprising a level control circuit including a variable gain amplifier (VGA) that receives and amplifies signals generated in the component or circuit, and a feedback loop connected between the VGA and the sampler for controlling the gain of the variable gain amplifier.

8. The system of claim 1, wherein the sampler is a directional coupler.

9. The system of claim 1, further comprising an intermod cancellation pre-selector for reducing levels of frequencies within the sampled output signal other than the frequency of the target intermod.

10. A method for adaptively eliminating intermods from a spectrum generated by combining two or more signals in a component or circuit, comprising:
    sampling an output signal of the component or circuit;

generating a conversion signal having a frequency matched to a target intermod of the spectrum;

generating a cancellation phasor having a phase and amplitude configured to cancel the target intermod based on the generated conversion signal and the sampled output signal, wherein generating the cancellation phasor includes mixing the generated conversion signal and the sampled output signal to obtain I and Q components, integrating and amplifying the I and Q components, reversing a polarity of the I and Q components, and mixing the generated conversion signal with the I and Q components to generate the cancellation phasor; and combining the cancellation phasor into the component or circuit to cancel the target intermod from the spectrum generated by the combining of the two or more signals.

11. The method of claim 10, further comprising:

setting a frequency of the conversion signal generated by the signal source based on the two or more signals in the component or circuit and an intermod selected from a series of intermods generated by the two or more signals to be the target intermod;

wherein the signal source is adaptively resettable based on one or both of a change in frequency of the two or more signals and a reselection of the target intermod.

12. The method of claim 10, further comprising:

generating a plurality of conversion signals, each having a frequency matched to a different respective target intermod of the spectrum; and generating a respective cancellation phasor for each of the different respective target intermods based on the associated conversion signal and the sampled output signal.

13. A non-transitory computer readable storage medium, including instructions stored thereon which when read and executed by one or more computers cause the one or more computers to perform the steps comprising:

sampling an output signal of the component or circuit;

generating a conversion signal having a frequency matched to a target intermod of the spectrum;

generating a cancellation phasor having a phase and amplitude configured to cancel the target intermod based on the generated conversion signal and the sampled output signal, wherein generating the cancellation phasor includes mixing the generated conversion signal and the sampled output signal to obtain I and Q components, integrating and amplifying the I and Q components, reversing a polarity of the I and Q components, and mixing the generated conversion signal with the I and Q components to generate the cancellation phasor; and combining the cancellation phasor into the component or circuit to cancel the target intermod from the spectrum generated by the combining of the two or more signals.

14. The non-transitory computer readable storage medium of claim 13, further including instructions stored thereon which when read and executed by one or more computers cause the one or more computers to perform the steps comprising:

setting a frequency of the conversion signal generated by the signal source based on the two or more signals in the component or circuit and an intermod selected from a series of intermods generated by the two or more signals to be the target intermod;

wherein the signal source is adaptively resettable based on one or both of a change in frequency of the two or more signals and a reselection of the target intermod.

15. The non-transitory computer readable storage medium of claim 13, further including instructions stored thereon which when read and executed by one or more computers cause the one or more computers to perform the steps comprising:

generating a plurality of conversion signals, each having a frequency matched to a different respective target intermod of the spectrum; and generating a respective cancellation phasor for each of the different respective target intermods based on the associated conversion signal and the sampled output signal.

* * * * *